US008618865B1

(12) United States Patent
Lu

(10) Patent No.: US 8,618,865 B1
(45) Date of Patent: Dec. 31, 2013

(54) CAPACITIVE IMAGING DEVICE WITH ACTIVE PIXELS

(71) Applicant: Palo Alto Research Center Incorporated, Palo Alto, CA (US)

(72) Inventor: JengPing Lu, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/667,112

(22) Filed: Nov. 2, 2012

(51) Int. Cl.
*H03K 17/96* (2006.01)

(52) U.S. Cl.
USPC ........................................................ 327/517

(58) Field of Classification Search
USPC ................... 327/509, 517, 534, 536
See application file for complete search history.

(56) References Cited

U.S. PATENT DOCUMENTS

| 5,325,442 | A | 6/1994 | Knapp |
| 5,940,526 | A | 8/1999 | Setlak et al. |
| 6,191,593 | B1 | 2/2001 | Tartagni et al. |
| 6,246,043 | B1 * | 6/2001 | Merrill ....................... 250/208.1 |
| 6,437,341 | B1 | 8/2002 | Izumi et al. |
| 7,616,786 | B2 | 11/2009 | Setlak |
| 7,755,369 | B2 | 7/2010 | Chuang et al. |
| 8,441,459 | B2 * | 5/2013 | Chen et al. ..................... 345/174 |
| 8,519,320 | B2 * | 8/2013 | Miyazawa et al. ......... 250/214.1 |
| 2005/0094855 | A1 | 5/2005 | Proano et al. |
| 2012/0075168 | A1 | 3/2012 | Osterhout et al. |

FOREIGN PATENT DOCUMENTS

| CN | 102017147 | 4/2011 |
| JP | 2010517250 | 5/2010 |

OTHER PUBLICATIONS

Hong, "On-chip Spatial Image Processing with CMOS Active Pixel Sensors", 2001, 234 pages.

* cited by examiner

*Primary Examiner* — Jeffrey Zweizig
(74) *Attorney, Agent, or Firm* — Hollingsworth Davis, LLC

(57) ABSTRACT

An apparatus includes a sensor array with a plurality of active pixels. Each active pixel in the sensor array includes: a three transistor (3T) sensor with a source follower transistor, and a detection diode coupled in series to a parasitic capacitor at a sensing junction. A gate of the source follower transistor amplifier is coupled to the sensing junction. The apparatus includes an insulator layer over the sensor array. The insulator layer provides a variable capacitance to the sensing junctions of underlying active pixels in response to portions of an object being proximate to the insulator layer. The variable capacitance is used to detect an image of the object.

20 Claims, 8 Drawing Sheets

CAPACITIVE IMAGING DEVICE WITH ACTIVE PIXELS

SUMMARY

Examples described herein are directed to a capacitive touch pattern sensor. In one embodiment, an apparatus includes a sensor array with a plurality of active pixels. Each active pixel in the sensor array includes: a three transistor (3T) sensor with a source follower transistor, and a detection diode coupled in series to a parasitic capacitor at a sensing junction. A gate of the source follower transistor amplifier is coupled to the sensing junction. The apparatus includes an insulator layer over the sensor array. The insulator layer provides a variable capacitance to the sensing junctions of underlying active pixels in response to portions of an object being proximate to the insulator layer. The variable capacitance is used to detect an image of the object.

In another embodiment, a method involves applying a first voltage level to a data line of a three-transistor (3T) sensor of an active pixel in a sensor array. The 3T sensor includes a source follower transistor coupled to the data line. The source follower transistor has a gate coupled to a sensing junction. A detection diode is coupled in series to a parasitic capacitor at the sensing junction. A second voltage level is applied to the data line, and a current flowing at the data line is determined in response to the second voltage level being applied. A variable capacitance of an insulator layer over the active pixel is determined based on the current. A proximity pattern at the insulator layer is determined based on the variable capacitance.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure relates to touch/proximity pattern sensors such as fingerprint sensors. Generally, finger prints (and similar patterns, e.g., on hands and feet) are readily accessible biometric indicators that are unique to each person. As a result, computer scanned hand/finger print images can be used for purposes such as authentication. For example, a scanning sensor may include a flat surface against which to place the finger (or any scanned object). In response to the contact, the sensor generates an image of the texture/contours of the scanned object. Pattern recognition software can compare metrics of the scanned image to stored metrics, and confirm identity based on a match of the metrics.

There are a number of ways a fingerprint image can be obtained, such as using optical sensors. Embodiments described below use capacitive sensing. Generally, an object that touches a sensing surface will affect the local electric capacitance of the surface wherever there is contact. While capacitive touch input sensing is widely used to determine coarse indications of contact location (e.g., touchscreens, touchpads), the sensors described herein may be capable of much higher resolution (e.g., on the order of 500 dpi) than a conventional touch input sensor. It will be understood that, while the embodiments herein may be described in the context of biometric touch sensing, the embodiments and variations thereof may be applicable to other devices. For example, devices such as non-destructive testing imagers may obtain an image based on portions of an object that touch and/or are in relatively close proximity to a contact sensing element.

Figure 1:
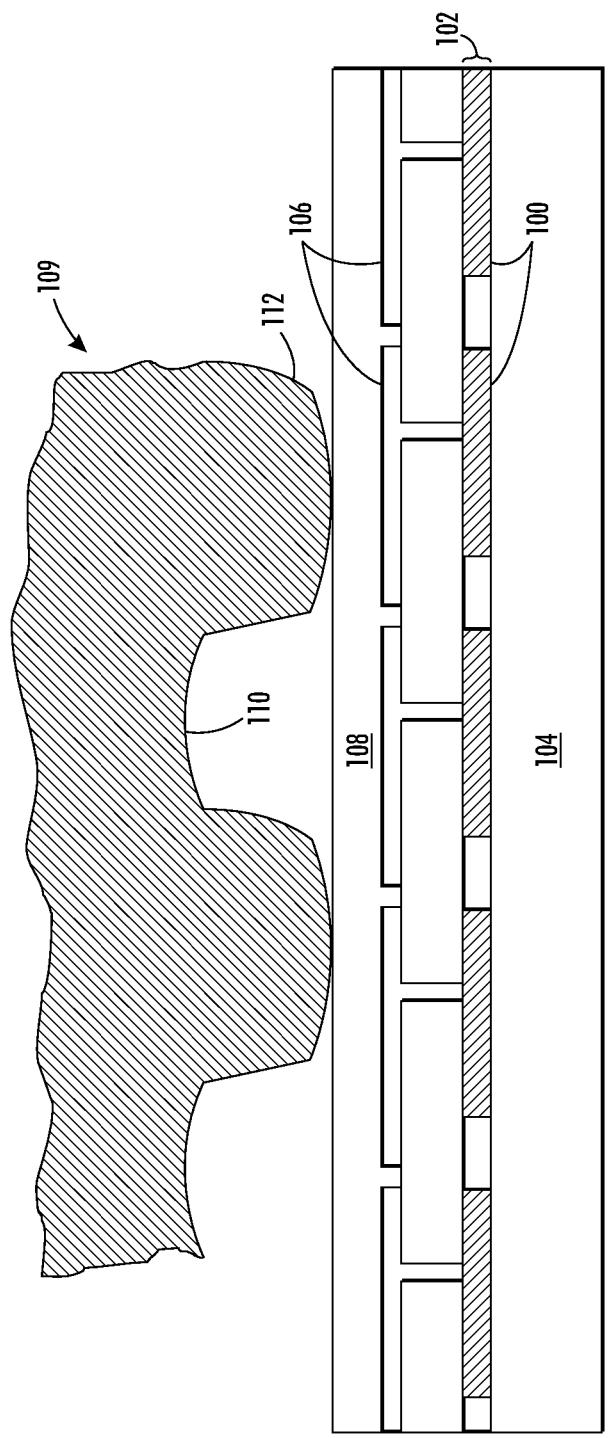
FIG. 1 is a cross sectional view of a capacitive touch pattern sensor according to an example embodiment.

In reference now to FIG. 1, a cross sectional view illustrates a capacitive touch pattern sensor according to an example embodiment. A sensor array 102 is built on top of a substrate 104 (e.g., glass). The sensor array 102 includes a plurality of active pixels 100, examples of which will be described further below. Generally, each pixel 100 is electrically coupled to sensing pads 106. The pads 106 are electrically conductive and covered by an insulator layer 108. The insulator layer 108 may be made from a protective coating polymer such as Parylene. A conductive object 109 contacting the insulating layer 108 changes a local capacitance at the pads 106, and this is detected by active pixels 100 that are coupled to the affected pads 106. For example, a fingerprint ridge 112 will cause a capacitance to be measured at a pad 106 directly below the ridge 112 that is different than another pad 106 directly below fingerprint valley 110. The capacitance may vary not only based on contact versus non-contact, but may also vary depending on the relative proximity of non-contacting portions. For example, different fingerprint valleys may cause different capacitance due to different distances from a surface of the insulating layer 108.

Figure 2:
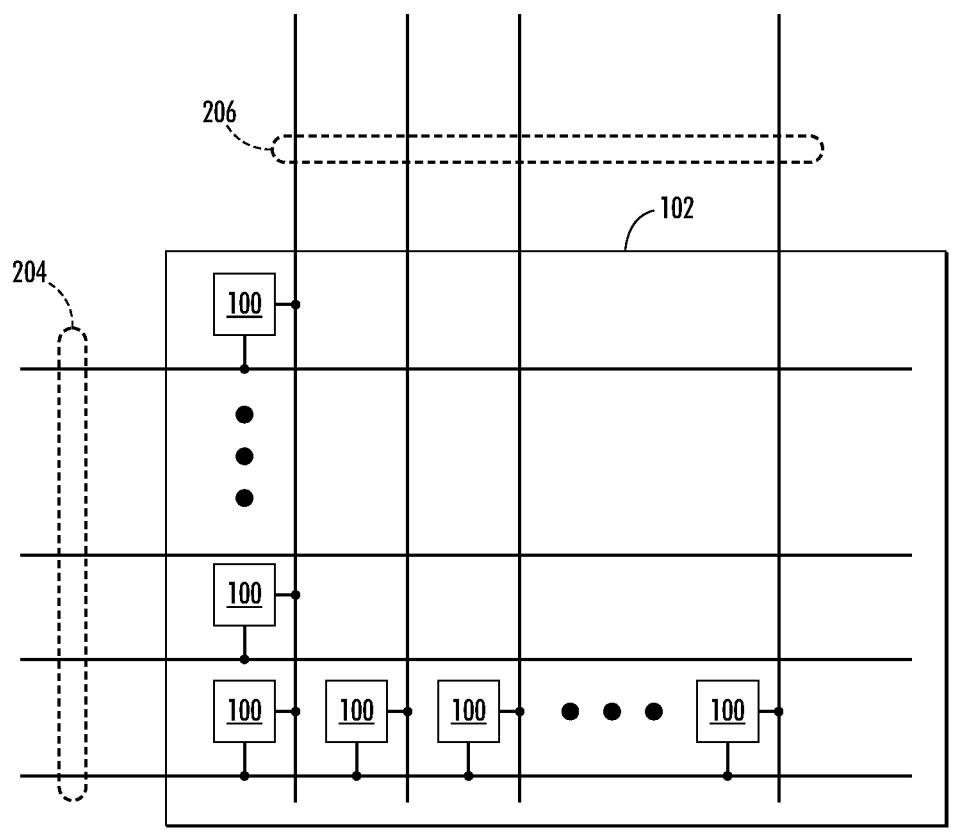
FIG. 2 is a block diagram illustrating details of a sensor array according to an example embodiment.

In reference now to FIG. 2, a block diagram illustrates details of a sensor array 102 according to an example embodiment. The sensor array 102 includes a number of individual active pixel elements 100. Each of these elements 100 are associated with one of a row line 204 and a column line 206. Generally, to detect an image, each of the row lines 204 may be activated in sequence. Activating a row line 204 causes all elements 100 in the rows to become active (e.g., switching on an enabling transistor). Then each of the column lines (e.g., data lines) 206 is scanned to read the individual elements 100 in the currently activated row. Alternate methods of scanning the elements 100 are known in the art, and the embodiments need not be limited to what is shown in FIG. 2.

As will be described in greater detail below, the reading of each column line 206 may involve applying to each column line 206 a first voltage level for a first period of time, and then switching to a second, lower voltage level for a second period of time. The first voltage level charges the currently read element 100, and the second voltage level causes a current flow via the column line that indicates a sensed capacitance of the element 100.

Figure 3:
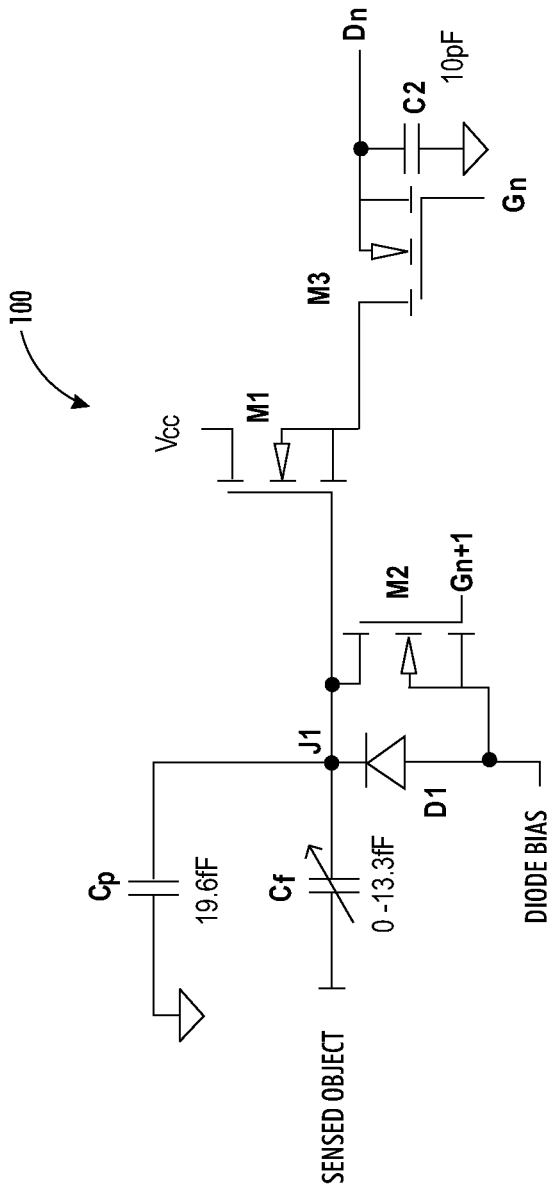
FIG. 3 is, a schematic diagram illustrating an active pixel circuit according to an example embodiment.

In reference now to FIG. 3, a schematic diagram illustrates an active pixel 100 according to an example embodiment. The active pixel 100 is generally configured as a three transistor sensor, sometimes abbreviated as a 3T sensor pixel. The three transistors M1, M2, M3 in this diagram are n-type, lowtemperature, polycrystalline silicon (Poly-Si) thin-film transistors (TFTs) although it may be possible to use other types of transistor devices such as metal oxide semiconductor, field-effect transistors (MOSFETs). However, TFTs may hold an advantage over MOSFET, such as cost and ease of manufacture. Transistor M2 is configured as a reset transistor in response to reset signal $G_{n+1}$. When $G_{n+1}$ is activated, M2 shorts out high frequency rectifying/detection diode D1, allowing sensing junction J1 to be tied to the biasing voltage of D1. By tying the reset transistor M2 to the enable line of the following row ($G_{n+1}$), the active pixels 100 can be reset without using a separate set of reset lines. In other configurations, M2 may be reset by another line, such as the preceding row enable ($G_{n-1}$), a separate reset line, a data line Dn of an adjacent column, etc.

A seen in FIG. 3, two capacitors, $C_p$ and $C_f$ are coupled to the detection diode D1 at sensing junction J1. The $C_p$ component is a parasitic capacitor, having one end coupled to the sensing junction J1 and the other end at ground. The $C_f$ component models the sensed capacitance of the pads and insulating layer (see sensing pads 106 and insulating layer 108 in FIG. 1). The effective value of $C_f$ may vary from zero (or near zero) to some maximum value (in this example on the order of 10 fF) depending on whether or not an object (e.g., fingerprint ridge) is contacting the insulating layer. As will be described in greater detail below, the sensed capacitance can be found based on a ratio of gate capacitance of M1 ($C_{M1}$) and the sum of $C_f$, $C_p$, and $C_{M1}$.

The M1 transistor is configured as a source follower having its gate tied to the sensing junction J1. The output of M1 is tied to data line Dn when enabling transistor M3 is switched on in response to enable signal Gn. The transistor M1 also acts as a charge pump to charge up capacitors $C_f$ and $C_p$. This charging occurs during the operation cycle of the pixel 100, when M3 is enabled. In one embodiment, the operation cycle is between 50-70 μs. During part of the cycle (charging interval), the potential of data line Dn is brought down to a first voltage level, which causes excess charge built up on gate capacitance $C_{M1}$ by current flowing through diode D1 to maintain a stable charge voltage $V_{charge} = V_{diode\_}$ bias.

When the data line voltage is returned to its original voltage in a later part of the operation cycle (sensing interval) the charge accumulated on the gate of M1 during charging interval will be redistributed among Cp, Cf, and $C_{M1}$. The final voltage ($V_{sense}$) at the sensing junction J1 at the end of sensing interval becomes input of source follower M1, and the output of M1 at this interval can be read out on Dn. The difference $\Delta V$ between the $V_{charge}$ and $V_{sense}$ potentials can be expressed as $\Delta V$ is approximately proportional to $C_{M1}/(C_f+C_p+C_{M1})$. Generally, the capacitance $C_f$ may be determined by measuring current flowing through Dn during the sensing interval.

Although specific component types and respective values are shown in FIG. 3, one of ordinary skill in the art will appreciate that component types and variables can vary from what is shown while still falling within the scope of the claimed invention. For example, the capacitance value of $C_{M1}$ and $C_p$ can modified from what is shown to match a physical configuration that provides sensed capacitance $C_f$. In one configuration, $C_f$ has been found to be on the order of 10 fF (between 11 fF and 100 fF) and so $C_{M1}$ and $C_p$ are selected to fall within a similar range. It should be noted that the value of $C_{M1}$ may be inherent in the TFT design, and so modification of $C_{M1}$ may be achieved by modifying physical configuration/physical dimension and/or type of transistor used, or by the addition of electrical components (e.g., inline capacitor). In another variation, p-channel transistors may be used in the circuit, e.g., by replacing the illustrated n-channel transistors with p-channel devices, and by reversing diode direction and voltage polarities.

Figure 4:
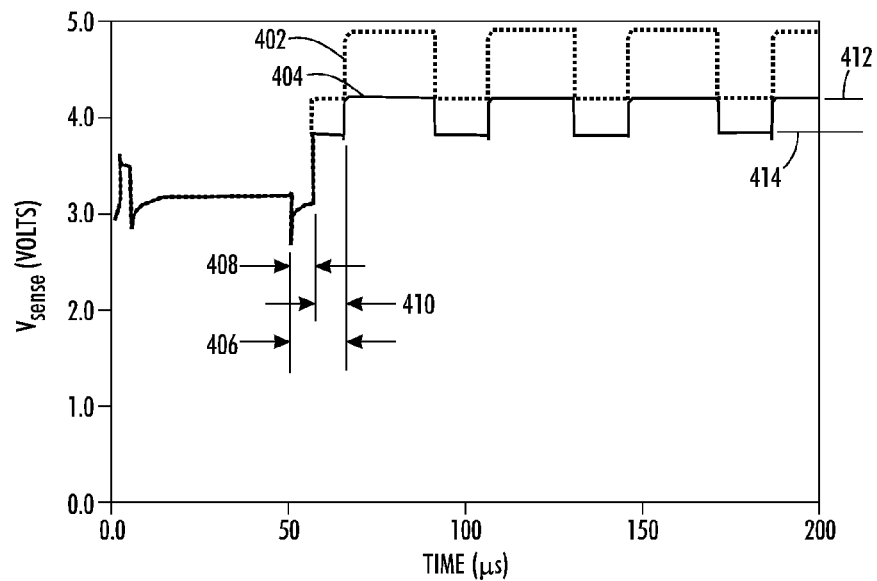
FIGS. 4 and 5 are graphs illustrating results of a SPICE simulation of a pixel configured as shown in FIG. 3.
Figure 5:
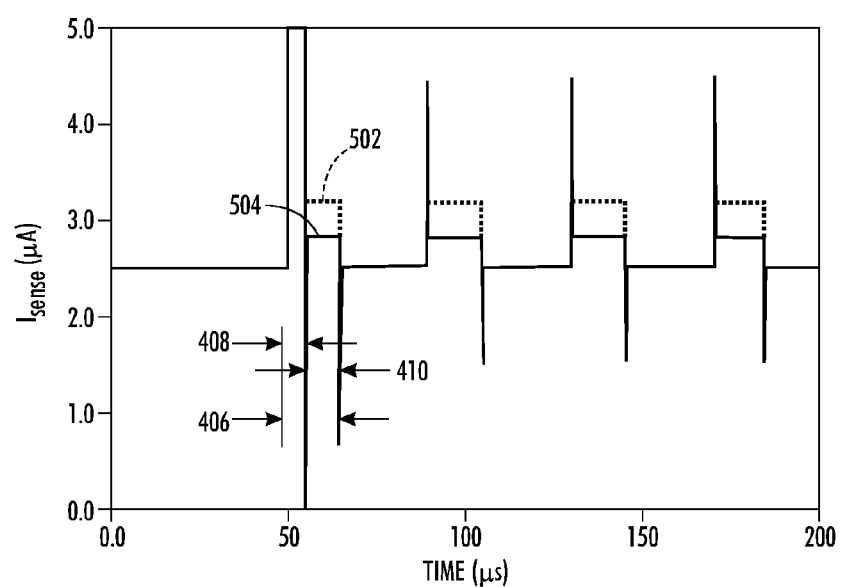

In reference now to FIGS. 4 and 5, graphs illustrates results of a SPICE simulation of a pixel 100 configured as shown in FIG. 3. In FIG. 4, traces 402 and 404 show the gate potential of M1 for $C_f=0$ and $C_f=13$ fF, respectively. Time period 406 represents an operation cycle of M1. Intervals 408 and 410 represent respective charging and readout intervals within the operational cycle 406. Voltages 412 and 414 are proportional to the different values of $C_f$, and can be used as basis for a detection signal, e.g., data line current out of the pixel 100. In FIG. 5, traces 502, 504 represent current out of the pixel 100 for $C_f=0$ and $C_f=13$ fF, respectively. The respective intervals 408, 410 are also shown in FIG. 5, and the different in current during sensing interval 410 can be used to determine sensed capacitance.

The potential difference applied to the data line between charging and readout intervals 408 and 410 can be provided by what is known as a data line reset switch. The data line reset switch includes TFTs located at the end of each data line, on the same substrate of pixel array. The TFTs are activated by a control line shared by all data line reset TFTs. When the data line reset switches are activated, they connect the data lines to an external voltage source and set the data line potential to the value defined by the voltage source. There are alternate ways to affect this potential difference. For example, $V_{ref}$ of readout charge amplifiers (coupled to readout lines 206 in FIG. 2) can be varied while a pixel is currently activated.

Figure 6:
FIG. 6 is a sample fingerprint image obtained from a capacitive touch pattern sensor according to an example embodiment.

By scanning each pixel in an active array as described above, a difference between a charge and sensing voltage causes a current to flow on the data line of each pixel. Measurements of these currents can be assembled into an image, such as the sample handprint image shown in FIG. 6. Because thin-film transistor (TFT) manufacturing technology is mature, it is possible to economically manufacture large-format (e.g., four fingers at once) finger print sensors using this type of active circuitry. This type of sensor is also capable of producing high quality scans. The scan quality is due at least in part to the high signal-to-noise ratio (SNR) obtainable using active capacitive sensor pixels.

Figure 7:
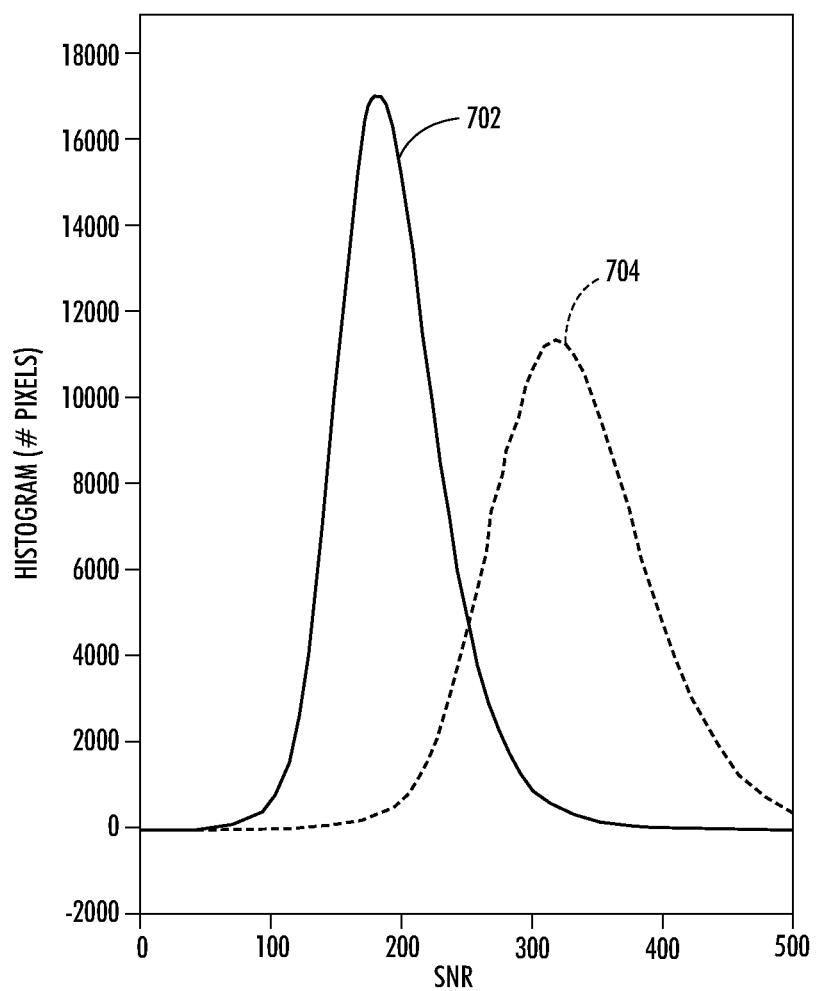
FIG. 7 is a histogram of measured signal-to-noise active pixels of a capacitive sensing device according to an example embodiment.

In reference now to FIG. 7, a histogram shows measured SNR for an active pixel capacitive sensing device according to an example embodiment. Curve 702 represents bright field SNR for a pixel array and curve 704 represents dark field SNR measurements for the same array. The peak of curve 702 is at 183, and the peak of curve 704 is 310. These average/median values are well above acceptable minimal SNR standards (e.g., SNR>125) for this type of device.

One reason the active pixel sensor described herein can achieve these SNR levels is due to the small capacitance values of $C_{M1}$, $C_f$, and $C_p$ as described above in reference to FIG. 3. The gate capacitance $C_{M1}$ is on the order of 10 fF (e.g., between 1 fF and 100 fF), which is comparable (e.g., same order of magnitude) to the plate capacitance across the insulator, modeled in FIG. 3 as $C_f$, and the value of the parasitic capacitor $C_p$. These low capacitances make the circuit very sensitive to changes in $C_f$. This, combined with the signal amplification provided by M2, provides superior sensitivity as reflected in the SNR measurements shown above.

Figure 8:
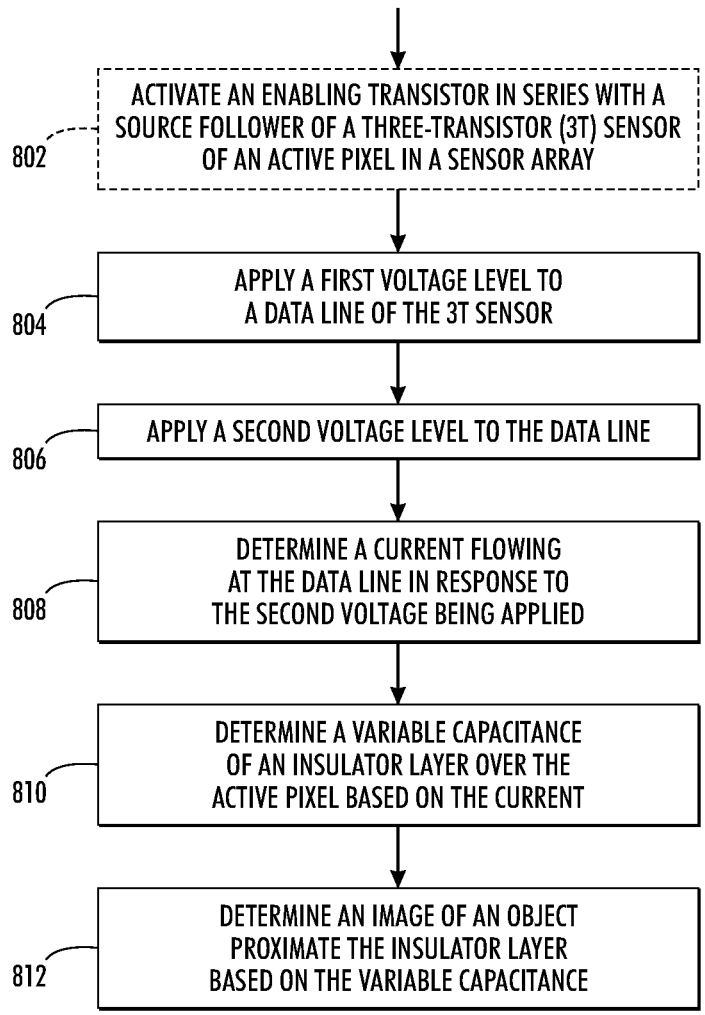
FIGS. 8 and 9 are flowcharts illustrating procedures according to example embodiments.

In reference now to FIG. 8, a flowchart illustrates a method according to an example embodiment. The method involves activating 802 an enabling transistor in series with a source follower of a 3T sensor of an active pixel in a sensor array. A first voltage level is applied 804 to a data line of the 3T sensor. A second voltage is then applied 806 to the data line. A current flowing at the data line in response to the second voltage being applied is determined 808. A variable capacitance of an insulator layer over the active pixel may be determined 810 based on the current, and an image of an object proximate the insulator layer may be determined 812 based on the variable capacitance.

Figure 9:
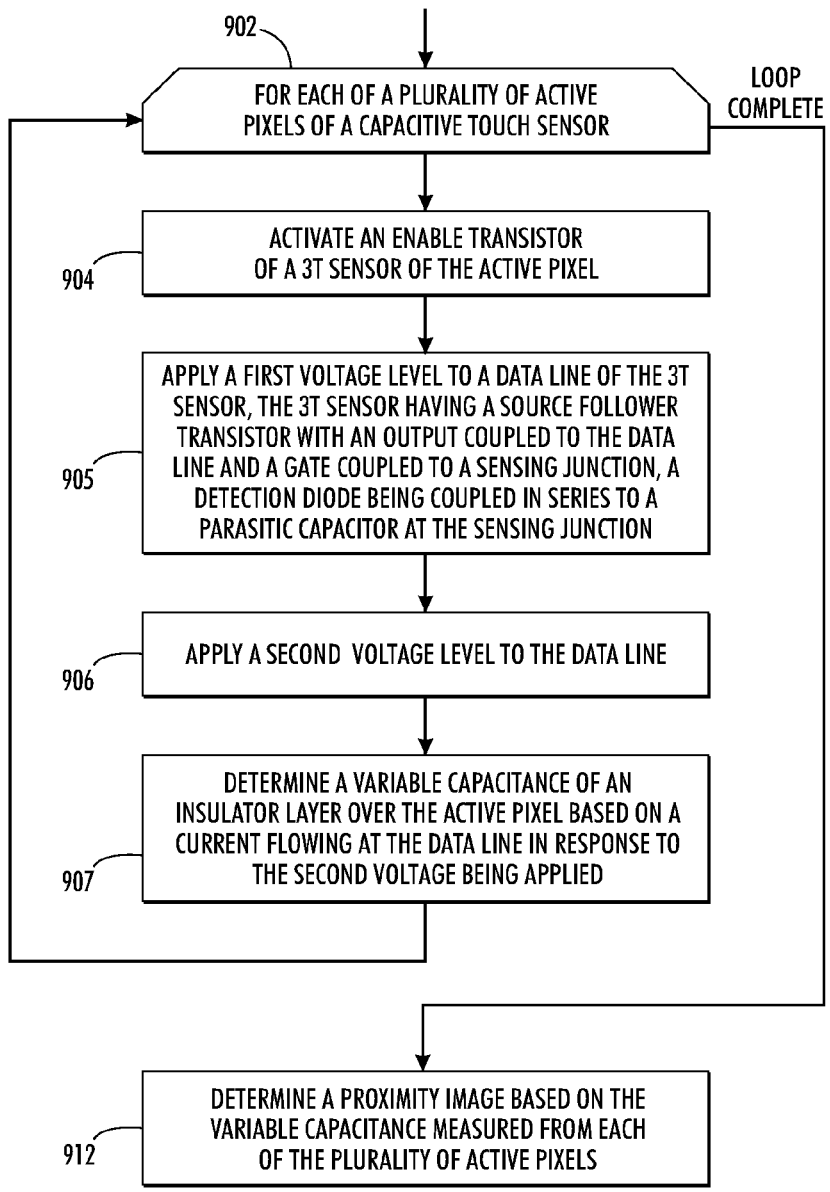

In reference now to FIG. 9, a flowchart illustrates a method according to an example embodiment. The method involves repeatedly performing operations 904-907, as indicated by loop entry block 902. The loop is performed for each of a plurality of active pixels of a capacitive touch sensor, e.g., via scanning some or all row and column lines of an array as shown in FIG. 2.

For each active pixel, an enable transistor of a 3T sensor of the active pixel is enabled 904, and may remain enabled at least during subsequent steps 905-907. A first voltage level is applied 905 to a data line of the active pixel. The 3T sensor has a source follower transistor coupled to the data line (e.g., via the enable transistor) with a gate coupled to a sensing junction. A detection diode is coupled in series to a parasitic capacitor at the sensing junction.

A second voltage is applied 906 to the data line. A variable capacitance of an insulator layer over the active pixel is determined 907 based on a current flowing at the data line in response to the second voltage being applied. When the loop 902 is complete, a proximity image is determined 912 based on the variable capacitance measured from each of the plurality of active pixels.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A capacitive image sensor, comprising:
    a sensor array comprising a plurality of active pixels, each active pixel in the sensor array comprising:
        a three-transistor (3T) sensor comprising a source follower transistor; and
        a detection diode coupled in series to a parasitic capacitor at a sensing junction, wherein a gate of the source follower transistor is coupled to the sensing junction; and
    an insulator layer over the sensor array, the insulator layer providing a variable capacitance to the sensing junctions of underlying active pixels in response to portions of an object being proximate to the insulator layer, the variable capacitance used to detect an image of the object.

2. The capacitive image sensor of claim 1, wherein the source follower transistor is configured as a charge pump for at least the parasitic capacitor and the insulator layer.

3. The capacitive image sensor of claim 1, wherein the source follower transistor charges at least the parasitic capacitor and the insulator layer in response to a first voltage level applied to a data line of the 3T sensor, and in response to a second voltage level being applied to the data line, a sensed voltage is amplified by the source follower transistor, wherein a current flowing through the data line in response to the sensed voltage is proportional to the variable capacitance at the insulator layer.

4. The capacitive image sensor of claim 1, wherein the source follow transistor has a gate capacitance ($C_{M1}$) that is the same order of magnitude as: 1) a capacitance value ($C_p$) of the parasitic capacitor and 2) a maximum value of the variable capacitance ($C_f$) provided by the insulator layer.

5. The capacitive image sensor of claim 4, wherein $C_{M1}$, $C_p$, and the maximum value of $C_f$ are on the order of 10 fF.

6. The capacitive image sensor of claim 4, wherein the sensing junction is brought to a charge voltage in response to a first voltage level applied to a data line of the 3T sensor, the charge voltage charging the gate capacitance, the parasitic capacitor, and the insulator layer, and in response to a second voltage level being applied to the data line, the sensing junction is brought to a sensed voltage that is amplified by the source follower transistor, wherein a current flowing through the data line in response to the sensed voltage is proportional to the variable capacitance at the insulator layer.

7. The capacitive touch pattern sensor of claim 6, wherein a difference between the charge voltage and the sensed voltage is approximately proportional to $C_{M1}/(C_f+C_p+C_{M1})$.

8. The capacitive touch pattern sensor of claim 1, wherein the sensor array provides a resolution of at least 500 dpi.

9. The capacitive touch pattern sensor of claim 1, wherein the insulator layer comprises a polymer layer, the sensor further comprising a plurality of electrically conductive pads coupling the insulator layer the sensing junctions of the underlying active pixels.

10. The capacitive touch pattern sensor of claim 1, wherein the 3T sensor further comprises a reset transistor in parallel with the detection diode, and an enabling transistor in series with the source follower transistor and a data line.

11. A method comprising:
    applying a first voltage level to a data line of a three-transistor (3T) sensor of an active pixel in a sensor array, the 3T sensor comprising a source follower transistor with an output coupled to the data line, a gate of the source follower transistor coupled to a sensing junction, wherein a detection diode is coupled in series to a parasitic capacitor at the sensing junction;
    applying a second voltage level to the data line;
    determining a current flowing at the data line in response to the second voltage level being applied;
    determining a variable capacitance of an insulator layer over the active pixel based on the current; and
    determining a proximity pattern at the insulator layer based on the variable capacitance.

12. The method of claim 11, wherein the source follower transistor is configured as a charge pump for at least the parasitic capacitor and insulator layer.

13. The method of claim 11, wherein the source follower transistor charges at least the parasitic capacitor and insulator layer in response to the first voltage level being applied, and in response to the second voltage level being applied, a sensed voltage is amplified by the source follower transistor, wherein the current at the data line is proportional to the variable capacitance at the insulator layer.

14. The method of claim 11, wherein the source follow transistor has a gate capacitance ($C_{M1}$) that is the same order of magnitude as: 1) a capacitance value ($C_p$) of the parasitic capacitor and 2) a maximum value of the variable capacitance ($C_f$) of the insulator layer.

15. The method of claim 14, wherein $C_{M1}$, $C_p$, and the maximum value of $C_f$ are on the order of 10 fF.

16. The method of claim 14, wherein the sensing junction is brought to a charge voltage in response to the first voltage level being applied, the charge voltage charging the gate capacitance, the parasitic capacitor, and the insulator layer, and in response the second voltage level being applied to the data line, the sensing junction is brought to a sensed voltage that is amplified by the source follower transistor.

17. The sensor of claim 16, wherein a difference between the charge voltage and the sensed voltage is approximately proportional to $C_{M1}/(C_f+C_p+C_{M1})$.

18. The method of claim 11, wherein the insulator layer comprises a polymer layer, the sensor further comprising a plurality of electrically conductive pads coupling the insulator layer the sensing junctions of the underlying active pixels.

19. The method of claim 11, further comprising activating an enabling transistor in series with the source follower transistor at least when the applying the first and second voltage levels and determining the current flowing at the data line.

20. A method comprising:

scanning a plurality of active pixels of a capacitive touch sensor, wherein each of the active pixels comprises a three-transistor (3T) sensor, wherein scanning involves performing, for each active pixel, activating an enable transistor of the 3T sensor, and while the enable transistor is activated:

applying a first voltage level to a data line of the 3T sensor, the 3T sensor comprising a source follower transistor with an output coupled to the data line, the source follower transistor having a gate coupled to a sensing junction, wherein a detection diode is coupled in series to a parasitic capacitor at the sensing junction;

applying a second voltage level to the data line; and determining a variable capacitance of an insulator layer over the active pixel based on a current flowing at the data line in response to the second voltage level being applied; and determining a proximity image based on the variable capacitance measured from each of the plurality of active pixels.

* * * * *